United States Patent
Sakamoto et al.

(10) Patent No.: US 8,383,320 B2
(45) Date of Patent: Feb. 26, 2013

(54) RESIST UNDERLAYER FILM FORMING COMPOSITION AND METHOD OF FORMING RESIST PATTERN USING THE SAME

(75) Inventors: Rikimaru Sakamoto, Toyama (JP); Yoshiomi Hiroi, Toyama (JP); Tomohisa Ishida, Toyama (JP); Takafumi Endo, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 479 days.

(21) Appl. No.: 12/682,819

(22) PCT Filed: Oct. 16, 2008

(86) PCT No.: PCT/JP2008/068774
§ 371 (c)(1),
(2), (4) Date: Apr. 13, 2010

(87) PCT Pub. No.: WO2009/057458
PCT Pub. Date: May 7, 2009

(65) Prior Publication Data
US 2010/0221657 A1    Sep. 2, 2010

(30) Foreign Application Priority Data
Oct. 31, 2007   (JP) ................ 2007-283167

(51) Int. Cl.
*G03F 7/11*     (2006.01)
*G03F 7/20*     (2006.01)
*C08G 59/14*    (2006.01)
*H01L 21/027*   (2006.01)

(52) U.S. Cl. .................... 430/271.1; 525/459
(58) Field of Classification Search ................... None
See application file for complete search history.

(56) References Cited

U.S. PATENT DOCUMENTS
2004/0110089 A1   6/2004   Neef et al.

FOREIGN PATENT DOCUMENTS

| | | |
|---|---|---|
| EP | 1 876 495 A1 | 1/2008 |
| GB | 1325974 A * | 8/1973 |
| JP | A-2004-212907 | 7/2004 |
| JP | A-2005-321752 | 11/2005 |
| WO | WO 03/017002 A1 | 2/2003 |
| WO | WO 2006/115074 A1 | 11/2006 |

OTHER PUBLICATIONS

Nov. 11, 2008 International Search Report issued in corresponding International Patent Application No. PCT/JP2008/068774.

* cited by examiner

*Primary Examiner* — Cynthia Hamilton
(74) *Attorney, Agent, or Firm* — Oliff & Berridge, PLC

(57) ABSTRACT

There is provided a composition for forming a resist underlayer film not only having a large selection ratio of a dry etching rate but also exhibiting desired values of the k value and of the refractive index n at a short wavelength such as a wavelength of an ArF excimer laser. A resist underlayer film forming composition for lithography comprising: a linear polymer; and a solvent, wherein a backbone of the linear polymer has a unit structure in which 2,4-dihydroxy benzoic acid is introduced through an ester bond and an ether bond.

6 Claims, No Drawings

RESIST UNDERLAYER FILM FORMING COMPOSITION AND METHOD OF FORMING RESIST PATTERN USING THE SAME

TECHNICAL FIELD

The present invention relates to a composition useful in forming a resist underlayer film between a substrate and a resist film formed on the substrate for obtaining a resist pattern in a desired form in a lithography process as a process of the production of semiconductor devices. In addition, the present invention relates to a resist underlayer film forming composition suitable for a lithography process using an immersion exposure apparatus. When a resist underlayer film suppresses an influence of a reflected wave on a resist film during the exposure of the resist film, the resist underlayer film can be called an antireflective film.

BACKGROUND ART

There is a known composition to form an antireflective film used in a lithography process using an ArF excimer laser (wavelength: about 193 nm) as a light source (see Patent Document 1). Patent Document 1 discloses a composition containing acrylic resins which are copolymers and have a benzene ring, a lactone ring and a hydroxyalkyl group each independently in side chains of the copolymer.

Patent Document 2 discloses an antireflective film forming composition containing a reaction product between an isocyanuric acid compound having two or three 2,3-epoxypropyl groups and a benzoic acid compound. Further, Patent Document 3 discloses in Example 1 thereof, an antireflective film forming composition containing a reaction product between tris(2,3-epoxypropyl) isocyanurate and 4-hydroxybenzoic acid. However, in both of Patent Documents 2 and 3, there is not disclosed the use of 2,4-dihydroxy benzoic acid.

As for others, there is a known antireflective film forming composition containing 2,4-dihydroxy benzoic acid (see Patent Document 4). Patent Document 4 discloses in Example 5 thereof, a composition containing a reaction product obtained using as a compound having at least two glycidyl ether structures, polyglycerol polyglycidyl ether and as an aromatic compound, 2,4-dihydroxy benzoic acid and benzoic acid. However, there is not disclosed a linear polymer obtained by a condensation polymerization of a di-functional diglycidyl ester compound with 2,4-dihydroxy benzoic acid. When the multi-functional glycidyl ether as described above is used, the reaction product is mainly an oligomer and thus is difficult to develop into a high molecular weight and has low thermal stability, so that there is caused a problem that when a composition containing the reaction product is thermally cured, a large amount of sublimates is generated, which have been elucidated by the study of the inventors of the present invention.

Patent Document 1: International Publication No. WO 03/017002 pamphlet

Patent Document 2: Japanese Patent Application Publication No. JP-A-2005-321752

Patent Document 3: U.S. Patent Application Publication No. 2004/6110089 specification Patent Document 4: Japanese Patent Application Publication No. JPA-2004-212907.

DISCLOSURE OF THE INVENTION

Problem to be Solved by the Invention

A resist pattern formed on the resist underlayer film desirably has a rectangular-shaped cross section in a direction perpendicular to the substrate. As one technique for obtaining a rectangular shape, enhancing an aromatic ring density in the resist underlayer film is known from the experience of the inventors of the present invention. However, by introducing a large amount of an aromatic compound (benzene ring), the attenuation coefficient (k value) at a wavelength of 193 nm tends to become higher, and the dry etching rate tends to become lower. Therefore, the design of light absorbing components for maintaining an appropriate k value and an appropriate etching rate is important.

For the resist underlayer film, it is required to have a dry etching rate higher (a selection ratio of dry etching rate larger) than that of the resist film. However, a resist underlayer film formed from a composition containing a polymer that is an acrylic resin or a methacrylic resin does not necessarily have a satisfactory dry etching rate. It is considered that this is because a bond between carbon atoms (C—C bond) constituting the backbone of an acrylic resin or a methacrylic resin is not easily broken by dry etching.

In addition, when an immersion lithography process is adopted, it is considered that the larger the numerical aperture (NA) of a projector lens of an immersion exposure apparatus is, the less desirable a resist underlayer film having a high attenuation coefficient (k value) for controlling the reflection of an incident wave is, and rather, it is effective for the resist underlayer film to have a low k value. By shifting the absorption wavelength by an aromatic compound introduced into side chains of the polymer, the k value at a specific wavelength can be lowered. For example, naphthalene can lower the k value at a wavelength of 193 nm. However, with respect to a resist underlayer film having a low k value at a wavelength of 193 nm, there is a problem that the refractive index n at the same wavelength is also unfavorably lowered. The lower the density of a benzene ring becomes, the more the k value at a wavelength of 193 nm can be lowered and the more the selection ratio of the dry etching rate can be enlarged. However, in this case, the cross section of the resist pattern in a direction perpendicular to the substrate is difficult to be made to be a rectangular form.

It is an object of the present invention to obtain a composition for forming a resist underlayer film not only having a large selection ratio of a dry etching rate but also exhibiting desired values of the k value and of the refractive index n at a short wavelength such as a wavelength of an ArF excimer laser, despite the composition containing an aromatic ring such as a benzene ring. In addition, it is another object of the present invention to obtain a resist underlayer film forming composition for forming a resist pattern having a desired form on the resist underlayer film. For the composition of the present invention, there are such conditions to be met that a formed resist underlayer film is insoluble in a solvent of a resist applied on the resist underlayer film, and that an intermixing between a formed resist underlayer film and a resist film is not caused.

Means for Solving the Problem

According to a first aspect of the present invention, a resist underlayer film forming composition for lithography contains a linear polymer and a solvent, and is characterized in that a backbone of the linear polymer has a unit structure in which 2,4-dihydroxy benzoic acid is introduced through an ester bond and an ether bond. The backbone of the linear polymer has an ester bond of —C(=O)—O— and an ether bond of —O—. The linear polymer in the present invention is a straight chain polymer having no branch point and includes no branched polymer or no cyclic polymer.

According to a second aspect of the present invention, a resist underlayer film forming composition for lithography contains a polymer having a repeating unit structure of Formula (1):

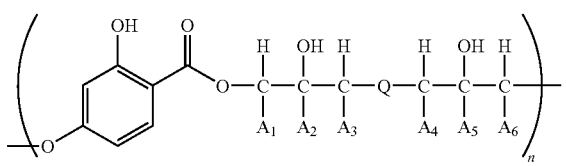
(1)

(where $A_1$, $A_2$, $A_3$, $A_4$, $A_5$ and $A_6$ are independently a hydrogen atom, a methyl group or an ethyl group; Q is a divalent organic group between two carbon atoms; and n is the repeating number of a unit structure and is an integer of 10 to 10,000), and a solvent. The divalent organic group has at least one carbon atom bonded directly or indirectly to the two carbon atoms.

In Formula (1), Q is, for example a group of Formula (2):

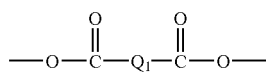
(2)

(where $Q_1$ is a $C_{1-10}$ alkylene group, a divalent organic group having a $C_{3-10}$ alicyclic hydrocarbon, a phenylene group, a naphthylene group or an anthrylene group, where the phenylene group, the naphthylene group and the anthrylene group may be independently substituted with at least one group selected from a group consisting of a $C_{1-6}$ alkyl group, a halogen atom, a $C_{1-6}$ alkoxy group, a nitro group, a cyano group and a $C_{1-6}$ alkylthio group).

In Formula (1), Q is, for example a group of Formula (3):

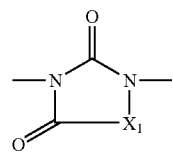
(3)

(where $X_1$ is a group of Formula (4) or Formula (5):

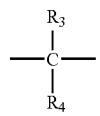
(4)

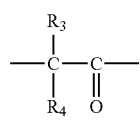
(5)

(where $R_3$ and $R_4$ are independently a hydrogen atom, a $C_{1-6}$ alkyl group, a $C_{3-6}$ alkenyl group, a benzyl group or a phenyl group, where the phenyl group may be substituted with at least one group selected from a group consisting of a $C_{1-6}$ alkyl group, a halogen atom, a $C_{1-6}$ alkoxy group, a nitro group, a cyano group and a $C_{1-6}$ alkylthio group, or $R_3$ and $R_4$ together with a carbon atom to which $R_3$ and $R_4$ are bonded may form a $C_{3-6}$ ring).

In a repeating unit structure of Formula (1), Q may further have a unit structure of Formula (2), besides a unit structure of Formula (3).

In Formula (1), Q is, for example a group of Formula (6):

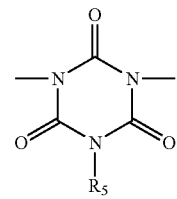
(6)

(where $R_5$ is a $C_{1-6}$ alkyl group, a $C_{1-6}$ alkenyl group, a benzyl group or a phenyl group, where the phenyl group may be substituted with at least one group selected from a group consisting of a $C_{1-6}$ alkyl group, a halogen atom, a $C_{1-6}$ alkoxy group, a nitro group, a cyano group and a $C_{1-6}$ alkylthio group).

In a repeating unit structure of Formula (1), Q may further have a unit structure of Formula (2), besides a unit structure of Formula (6).

In the present invention, examples of the alkyl group include a methyl group, an ethyl group, an isopropyl group, an n-butyl group and a cyclohexyl group. Examples of the $C_{1-10}$ alkylene group include a methylene group, an ethylene group, an n-propylene group, an n-pentylene group, an n-octylene group, a 2-methylpropylene group, a 1,4-dimethylbutylene group, a cyclopentylene group, a cyclobutylene group, a cyclohexylene group and a 2-methylcyclohexylene group. Examples of the $C_{3-10}$ alicyclic hydrocarbon include a cyclohexane ring and an adamantane ring. Examples of the $C_{1-6}$ alkoxy group include a methoxy group, an ethoxy group, an n-pentyloxy group, an isopropoxy group and a cyclohexyloxy group. Examples of the alkylthio group include a methylthio group, an ethylthio group, an n-pentylthio group, an isopropylthio group and a cyclohexylthio group. Examples of the alkenyl group include a 2-propenyl group and a 3-butenyl group. The alkyl group, the alkylene group, the alkoxy group and the alkylthio group are not limited to a linear group and may have a branched structure or a cyclic structure. Examples of the halogen atom include a fluorine atom, a chlorine atom, a bromine atom and an iodine atom.

The polymer having a repeating unit structure of Formula (1) is, for example a reaction product between a compound of Formula (7):

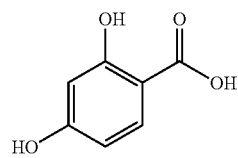
(7)

and at least one sort of compound of Formula (8):

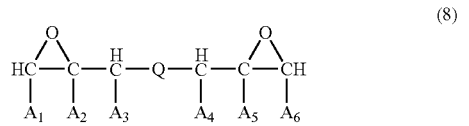 (8)

(where $A_1$, $A_2$, $A_3$, $A_4$, $A_5$ and $A_6$ are independently a hydrogen atom, a methyl group or an ethyl group; and Q is a divalent organic group between two carbon atoms).

In other words, the polymer having a repeating unit structure of Formula (1) can be obtained by a method including: dissolving a compound of Formula (7) and at least one sort of compound of Formula (8) in an organic solvent so that these compounds have an appropriate molar ratio; and polymerizing these compounds in the presence of a catalyst for activating an epoxy group. Examples of the catalyst for activating an epoxy group include: quaternary phosphonium salts such as ethyltriphenylphosphonium bromide; and quaternary ammonium salts such as benzyltriethylammonium chloride, and these catalysts may be used in an appropriate amount selected from a range of 0.1 to 10% by mass, based on the total mass of the used compound of Formula (7) and the used compound of Formula (8). The temperature and time for the polymerization reaction may be selected from ranges of 80 to 160° C. and 2 to 50 hours as the optimal conditions.

In Formula (8), Q is, for example a group of Formula (9):

 (9)

(where $Q_1$ is a $C_{1-10}$ alkylene group, a divalent organic group having a $C_{3-10}$ alicyclic hydrocarbon, a phenylene group, a naphthylene group or an anthrylene group, where the phenylene group, the naphthylene group and the anthrylene group may be independently substituted with at least one group selected from a group consisting of a $C_{1-6}$ alkyl group, a halogen atom, a $C_{1-6}$ alkoxy group, a nitro group, a cyano group and a $C_{1-6}$ alkylthio group).

The compound of Formula (8) is, for example a compound of Formula (10):

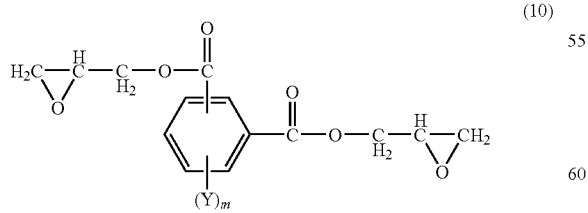 (10)

(where Y is a $C_{1-6}$ alkyl group, a halogen atom, a $C_{1-6}$ alkoxy group, a nitro group, a cyano group or a $C_{1-6}$ alkylthio group; and in is an integer of 0 to 4, where the Y may be identical or different when m is 2 to 4).

In Formula (8), Q is, for example a group of Formula (11):

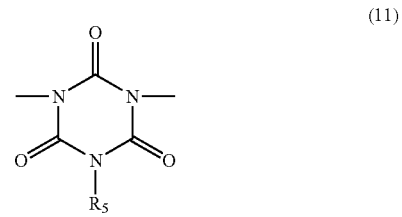 (11)

(where $R_5$ is a $C_{1-6}$ alkyl group, a $C_{3-6}$ alkenyl group, a benzyl group or a phenyl group, where the phenyl group may be substituted with at least one group selected from a group consisting of a $C_{1-6}$ alkyl group, a halogen atom, a $C_{1-6}$ alkoxy group, a nitro group, a cyano group and a $C_{1-6}$ alkylthio group).

Specific examples of the compound of Formula (8) include compounds of Formulae (12) to (20):

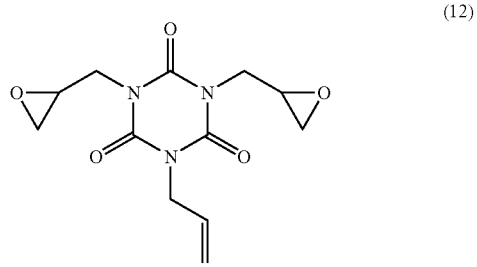 (12)

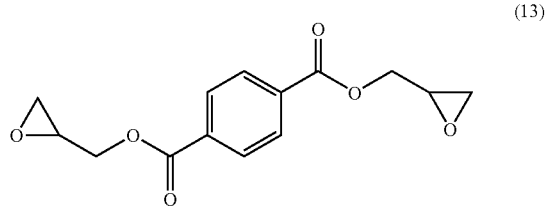 (13)

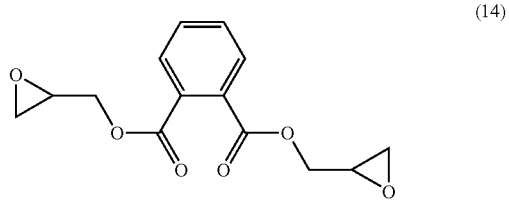 (14)

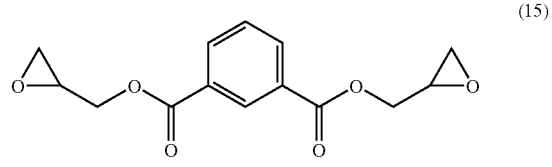 (15)

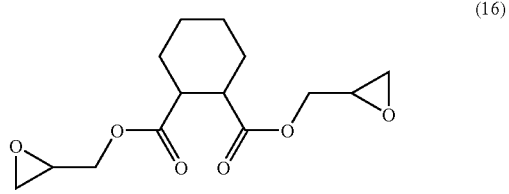 (16)

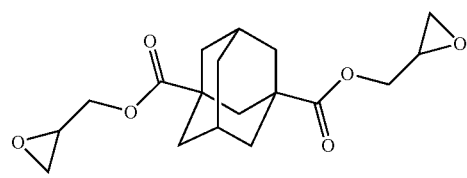
(17)
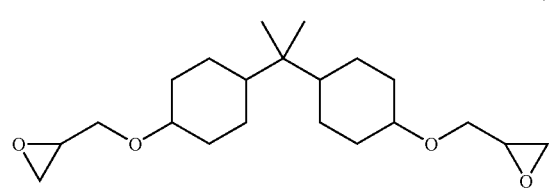
(18)
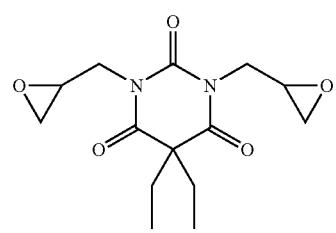
(19)
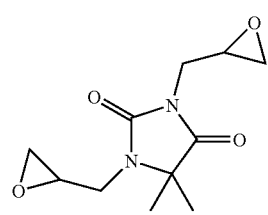
(20)
A repeating number of the repeating unit structure of Formula (1) is for example in a range of 10 or more to 10,000 or less.
Specific examples of the repeating unit structure of the linear polymer contained in the resist underlayer film forming composition of the present invention include Formulae (21) to (25):
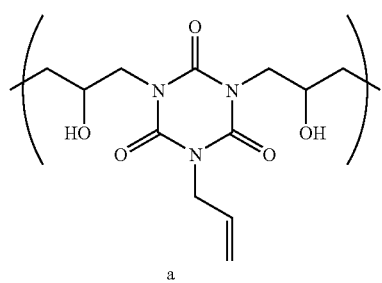
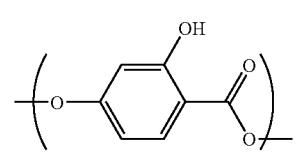
a:b = 1:1
(21)
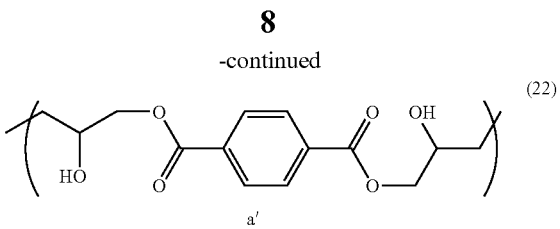
a′
(22)
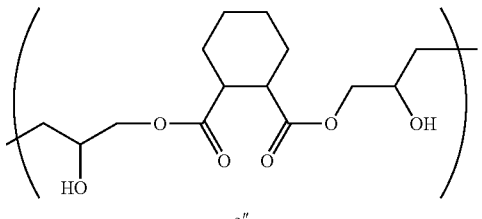
a″
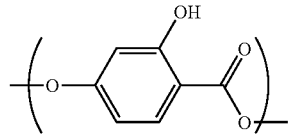
b
(a′ + a″):b = 1:1
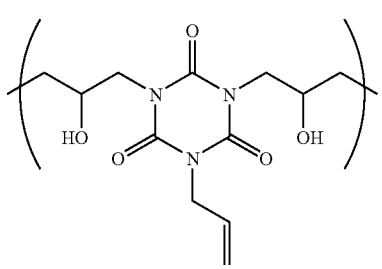
a′
(23)
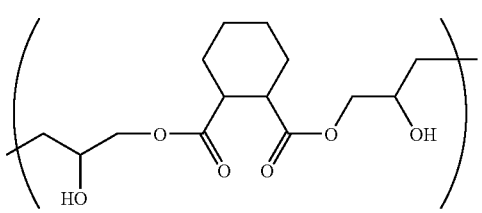
a″
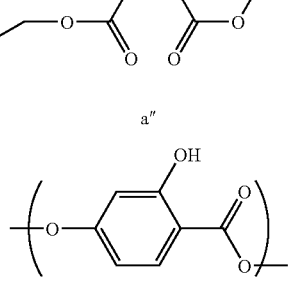
b
(a′ + a″):b = 1:1
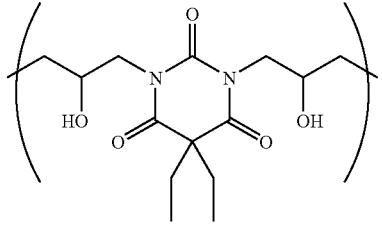
a
(24)

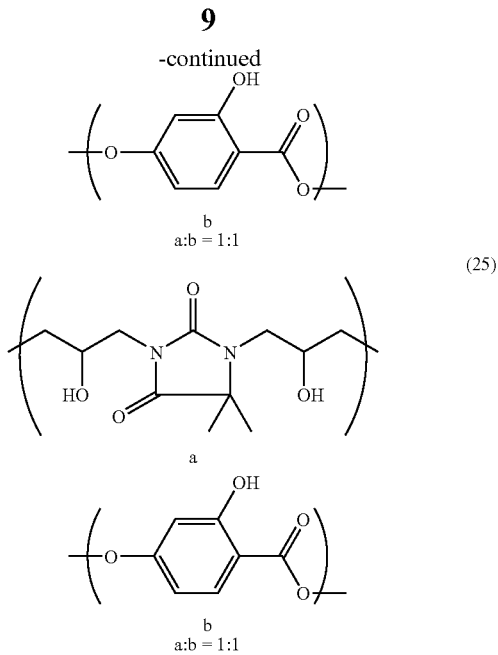

(25)

A polymer having a repeating unit structure of Formula (21) is obtained by polymerizing the compound of Formula (7) with a compound of Formula (12) which is a specific example of the compound of Formula (8). A polymer having a repeating unit structure of Formula (22) is obtained by polymerizing the compound of Formula (7) with two types of compounds of Formula (8) (a compound of Formula (13) and a compound of Formula (16)). A polymer having a repeating unit structure of Formula (23) is obtained by polymerizing the compound of Formula (7) with two types of compounds of Formula (8) (a compound of Formula (12) and a compound of Formula (16)). A polymer having a repeating unit structure of Formula (24) is obtained by polymerizing the compound of Formula (7) with a compound of Formula (19) which is a specific example of the compound of Formula (8). A polymer having a repeating unit structure of Formula (25) is obtained by polymerizing the compound of Formula (7) with a compound of Formula (20) which is a specific example of the compound of Formula (8).

In Formula (21), the molar ratio between a unit structure of a and a unit structure of b is 1:1. In Formula (22), a molar ratio of a unit structure of a', a molar ratio of a unit structure of a" and a molar ratio of a unit structure of b satisfy the equation: (a'+a"):b=1:1. In Formula (23), a molar ratio of a unit structure of a', a molar ratio of a unit structure of a" and a molar ratio of a unit structure of b satisfy the equation: (a'+a"):b=1:1. In Formula (24), a molar ratio between a unit structure of a and a unit structure of b is 1:1. In Formula (25), a molar ratio between a unit structure of a and a unit structure of b is 1:1.

In the molar ratio (a'+a"):b=1:1 with respect to Formula (22) and Formula (23), any one of a' and a" may be 0 and the molar ratio between a' and a" may be expressed as a':a"=(1−X):X (with proviso that 0≦x≦1). a' is a unit contributing to the absorption at a wavelength of 193 nm and on the contrary, a" is a unit that substantially does not contribute to the absorption at a wavelength of 193 nm. Accordingly, by varying the ratio between a' and a", the k value at a wavelength of 193 nm can be controlled to become the objective value, so that by lowering the ratio of a', the k value at a wavelength of 193 inn can be lowered.

Examples of the solvent contained in the resist underlayer film forming composition or the present invention include propylene glycol monomethyl ether (PGME), propylene glycol monomethyl ether acetate (PGMEA), propylene glycol monopropyl ether, methyl ethyl ketone, ethyl lactate, cyclohexanone, γ-butyrolactone, N-methylpyrrolidone and a mixture of two or more solvents selected from these solvents. Then, the content of the solvent in the resist underlayer film forming composition of the present invention is, for example 50% by mass or more and 99.5% by mass or less, based on the mass of the resist underlayer film forming composition.

The content of the linear polymer in the resist underlayer film forming composition of the present invention may be, for example 0.5% by mass or more and 30% by mass or less, based on the mass of the resist underlayer film forming composition.

The resist underlayer film forming composition of the present invention may contain besides the linear polymer and the solvent, a crosslinkable compound (a crosslinker) and further, a compound for accelerating a crosslinking reaction. When a component remaining after subtracting the solvent from the whole resist underlayer film forming composition, is defined as the solid content, the solid content contains the polymer and an additive blended in the composition if necessary such as a crosslinkable compound and a compound for accelerating the crosslinking reaction. The content of the polymer in the solid content is, for example 70% by mass or more and 98% by mass or less. When the composition contains no additive, the content of the polymer in the solid content may be 100% by mass.

The crosslinkable compound is, for example a nitrogen-containing compound having two to four nitrogen atoms to which a methylol group or an alkoxymethyl group is bonded, and the content thereof in the resist underlayer film forming composition of the present invention may be, for example 1% by mass or more and 30% by mass or less, based on the mass of the polymer contained in the resist underlayer film forming composition. Specific examples of the crosslinkable compound include hexamethoxymethylmelamine, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea and 1,1,3,3-tetrakis(methoxymethyl)urea.

The compound for accelerating the crosslinking reaction is, for example a sulfonic acid compound and may be a combination of a thermoacid generator and a sulfonic acid compound. The compound for accelerating the crosslinking reaction may be blended in the resist underlayer film forming composition of the present invention, for example in a content of 0.1% by mass or more and 10% by mass or less, based on the mass of the polymer contained in the resist underlayer film forming composition. Specific examples of the sulfonic acid compound include p-toluenesulfonic acid, trifluoromethanesulfonic acid, pyridinium-p-toluenesulfonic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid and pyridinium-1-naphthalenesulfonic acid. Specific examples of the thermoacid generator include 4-acetoxyphenyldimethylsulfonium hexafluoroarsenate, benzyl-4-hydroxyphenylmethylsulfonium hexafluoroantimonate, 4-acetoxyphenylbenzylmethylsulfonium hexafluoroantimonate, hydroxyphenylsulfonium hexafluoroantimonate, 4-acetoxyphenylbenzylsulfonium hexafluoroantimonate, 3-benzylbenzothiazolium hexafluoroantimonate, 2,4,4,6-tetrabromocyclohexadienone, benzointosylate and 2-nitrobenzyltosylate.

The resist underlayer film forming composition of the present invention may contain a surfactant and/or an adhesive assistant. The surfactant is an additive for enhancing the applicability of the composition relative to the substrate. As the surfactant, publicly known surfactants such as nonion-based surfactants and fluorinated surfactants may be used and the surfactant may be blended in the resist underlayer film forming composition of the present invention, for example in a content of 0.01% by mass or more and 2% by mass or less, based on the mass of the resist underlayer film forming composition. The adhesive assistant has an object of enhancing the adhesion of the resist underlayer film to the substrate or the resist film, and is an additive for suppressing the peeling of the resist film during the development after the exposure. Examples of the adhesive assistant include chlorosilanes, alkoxysilanes, silazanes, silanes and heterocyclic compounds, and the content thereof in the resist underlayer film forming composition of the present invention may be, for example 0.1% by mass or more and 2% by mass or less, based on the mass of the resist underlayer film forming composition.

According to a third aspect of the present invention, a forming method of a resist pattern for use in the production of a semiconductor device includes: a process for applying the resist underlayer film forming composition as described in the first or the second aspect of the present invention on a semiconductor substrate and baking the composition to form a resist underlayer film; a process for forming a resist film on the resist underlayer film; a process for exposing the semiconductor substrate coated with the resist underlayer film and the resist film to light; and a process for developing the resist film after the exposure. The baking means curing the applied composition using a heating means such as a hot plate.

The exposure performed in the third aspect of the present invention uses, for example an ArF excimer laser. Instead of the ArF excimer laser, EUV (wavelength: 13.5 nm) or an electron beam may also be used. The "EUV" is an abbreviation of the extreme ultraviolet. The resist for forming the resist film may be any one of a positive resist and a negative resist. As the resist, a chemical amplification-type resist sensitive to an ArF excimer laser, EUV or an electron beam can be used.

A representative semiconductor substrate used in the third aspect of the present invention is a silicon wafer. However, as the semiconductor substrate, an SOI (Silicon on Insulator) substrate or a compound semiconductor wafer such as gallium arsenide (GaAs), indium phosphide (InP) and gallium phosphide (GaP) may also be used. There may also be used a semiconductor substrate on which an insulating film such as a silicon oxide film, a nitrogen-containing silicon oxide film (SiON film) and a carbon-containing silicon oxide film (SiOC film) is formed. In this case, the resist underlayer film forming composition is applied on the insulating film.

EFFECTS OF THE INVENTION

The resist underlayer film forming composition of the present invention contains a linear polymer having in the backbone thereof, a 2,4-dihydroxy benzoic acid derivative introduced through an ester bond and an ether bond. The composition contains, for example a polymer having a repeating unit structure shown in Formula (1). Therefore, there can be obtained a resist underlayer film having a large selection ratio of dry etching rate relative to the resist film without lowering the aromatic ring density. The backbone of the linear polymer contained in the resist underlayer film forming composition of the present invention has a C—O bond (ester bond and ether bond) which is broken more easily than a C—C bond by dry etching, so that the resist underlayer film forming composition of the present invention can enhance the dry etching rate higher than that of a resist underlayer film forming composition in which the polymer is an acrylic resin or a methacrylic resin.

2,4-dihydroxy benzoic acid which is one of the raw material compounds for producing the polymer contained in the resist underlayer film forming composition of the present invention is an aromatic compound having in the molecule thereof, two hydroxyl groups and one carboxyl group. Then, by the effect of the substituents, 2,4-dihydroxybenzoic acid can shift the absorption wavelength of a benzene ring usually having the maximum absorption at around 200 nm toward an infrared region side to reduce the light absorption at 193 nm which is a wavelength for the exposure. Therefore, even when an aromatic compound is introduced into the polymer in a high amount, there can be obtained a resist underlayer film exhibiting a relatively low value (for example, a value of 0.3 or less and more than 0) of the k value as desired, which has exhibited a high value in a related-art resist underlayer film at the same wavelength, and a value of the refractive index n of more than 1.6. Accordingly, the resist underlayer film forming composition of the present invention can be applied to an immersion lithography process using an immersion exposure apparatus having a large numerical aperture (NA) of a projection lens and also to a so-called dry lithography process.

Since a 2,4-dihydroxy benzoic acid derivative having a benzene ring which is an aromatic ring is introduced into the backbone of the linear polymer, the density of the formed resist underlayer film can be enhanced and a resist pattern in a desired form (rectangular form of a cross section in a direction perpendicular to the substrate) can be formed.

BEST MODES FOR CARRYING OUT THE INVENTION

The resist underlayer film forming composition according to the present invention contains a reaction product between 2,4-dihydroxybenzoic acid of Formula (7) and at least one sort of compound of Formula (8). An epoxy group of at least one sort of compound of Formula (8) preferentially reacts with a hydroxyl group at the para-position relative to the carboxyl group out of the two hydroxyl groups of 2,4-dihydroxybenzoic acid. The reaction product is a polymer extending in a linear form, so that the molecular weight thereof can be easily controlled. In other words, a high-molecular weight compound can be obtained, so that the obtained polymer has high thermal stability and can reduce the generation of sublimates. When at least one sort of compound of Formula (8) is particularly a diglycidyl ester such as those of Formula (10), the obtained reaction product has higher thermal stability and can easily form a resist pattern in a desired form on the formed resist underlayer film without collapsing the pattern.

Hereinafter, the present invention will be further described more specifically referring to Synthetic Examples and Examples which should not be construed as limiting the scope of the present invention.

EXAMPLES

The weight average molecular weight shown in Synthetic Example 1 to Synthetic Example 5 is based on the measurement result by gel permeation chromatography (hereinafter, abbreviated as GPC). For the measurement, a GPC apparatus (manufactured by Tosoh Corporation) was used and the conditions for the measurement were as follows.

GPC column: Shodex (registered trademark), Asahipak (registered trademark) (manufactured by Showa Denko K.K.)

Column temperature: 40° C.
Solvent: N,N-dimethylformamide (DMF)
Flow rate: 0.6 ml/min
Standard sample: polystyrene (manufactured by Tosoh Corporation)

Synthesis Example 1

10.00 g of diglycidyl 1,2-cyclohexane dicarboxylate ester (manufactured by Tokyo Chemical Industry Co., Ltd.), 9.53 g of diglycidyl terephthalate ester (manufactured by Nagase ChemteX Corporation; trade name: Denacol (registered trademark) EX711), 10.12 g of 2,4-dihydroxy benzoic acid and 1.22 g of ethyltriphenylphosphonium bromide were dissolved in 72.04 g of propylene glycol monomethyl ether, and the resultant reaction solution was reacted at 130° C. for 24 hours to produce a solution of a polymer compound. The obtained polymer compound corresponded to Formula (22) (a':a":b=1:1:2 (molar ratio)) and was subjected to a GPC analysis and as a result of the analysis, the compound was found to have a weight average molecular weight (converted into that of the standard polystyrene) of 4,400.

Synthesis Example 2

50.00 g of diglycidyl 1,2-cyclohexane dicarboxylate ester (manufactured by Tokyo Chemical Industry Co., Ltd.), 20.39 g of diglycidyl terephthalate ester (manufactured by Nagase ChemteX Corporation; trade name: Denacol (registered trademark) EX711), 36.15 g of 2,4-dihydroxy benzoic acid and 4.35 g of ethyltriphenylphosphonium bromide were dissolved in 110.90 g of propylene glycol monomethyl ether, and the resultant reaction solution was reacted at 130° C. for 24 hours to produce a solution of a polymer compound. The obtained polymer compound corresponded to Formula (22) (a':a":b=3:7:10 (molar ratio)) and was subjected to a GPC analysis and as a result of the analysis, the compound was found to have a weight average molecular weight (converted into that of the standard polystyrene) of 7,500.

Synthesis Example 3

15.00 g of diglycidyl 1,2-cyclohexane dicarboxylate ester (manufactured by Tokyo Chemical Industry Co., Ltd.), 13.69 g of monoallyldiglycidyl isocyanuric acid (manufactured by Shikoku Chemicals Corporation), 15.18 g of 2,4-dihydroxy benzoic acid and 1.83 g of ethyltriphenylphosphonium bromide were dissolved in 45.70 g of propylene glycol monomethyl ether, and the resultant reaction solution was reacted at 130° C. for 24 hours to produce a solution of a polymer compound. The obtained polymer compound corresponded to Formula (23) (a':a":b=1:1:2 (molar ratio)) and was subjected to a GPC analysis and as a result of the analysis, the compound was found to have a weight average molecular weight (converted into that of the standard polystyrene) of 5,100.

Synthesis Example 4

15.00 g of monoallyldiglycidyl isocyanuric acid (manufactured by Shikoku Chemicals Corporation), 8.46 g of 2,4-dihydroxy benzoic acid and 1.02 g of ethyltriphenylphosphonium bromide were dissolved in 57.12 g of propylene glycol monomethyl ether, and the resultant reaction solution was reacted at 130° C. for 24 hours to produce a solution of a polymer compound. The obtained polymer compound corresponded to Formula (21) and was subjected to a GPC analysis and as a result of the analysis, the compound was found to have a weight average molecular weight (converted into that of the standard polystyrene) of 9,200.

Synthesis Example 5

15.00 g of monoallyldiglycidyl isocyanuric acid (manufactured by Shikoku Chemicals Corporation), 7.45 g of hydroxy benzoic acid and 1.00 g of ethyltriphenylphosphonium bromide were dissolved in 54.72 g of propylene glycol monomethyl ether, and the resultant reaction solution was reacted at 130° C. for 24 hours to produce a solution of a polymer compound. The obtained polymer compound corresponded to Formula (26) and was subjected to a GPC analysis and as a result of the analysis, the compound was found to have a weight average molecular weight (converted into that of the standard polystyrene) of 10,000, (26)

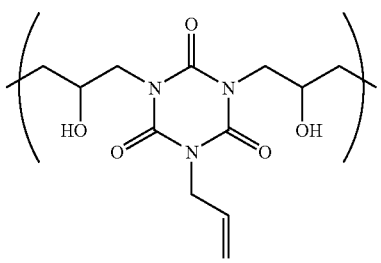

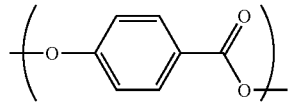

a:b = 1:1

Example 1

To 10 g of a solution containing 2 g of the polymer compound obtained in Synthesis Example 1, 0.5 g of tetramethoxymethyl glycoluril (manufactured by Nihon Cytec Industries Inc.; trade name: POWDERLINK (registered trademark) 1174) and 0.05 g of pyridinium-p-toluenesulfonic acid were mixed in and the resultant mixture was dissolved in 35.4 g of propylene glycol monomethyl ether and 18.6 g of propylene glycol monomethyl ether acetate to prepare a solution. Thereafter, the solution was filtered using a polyethylene microfilter having a pore diameter of 0.10 μm and further using a polyethylene microfilter having a pore diameter of 0.05 μm to prepare a solution of a resist underlayer film forming composition.

Example 2

To 10 g of a solution containing 2 g of the polymer compound obtained in Synthesis Example 2, 0.5 g of tetramethoxymethyl glycoluril (manufactured by Nihon Cytec Industries Inc.; trade name: POWDERLINK (registered trademark) 1174) and 0.05 g of pyridinium-p-toluenesulfonic acid were mixed in and the resultant mixture was dissolved in 35.4 g of propylene glycol monomethyl ether and 18.6 g of propylene glycol monomethyl ether acetate to prepare a solution. Thereafter, the solution was filtered using a polyethylene microfilter having a pore diameter of 0.10 μm and further using a polyethylene microfilter having a pore diameter of 0.05 μm to prepare a solution of a resist underlayer film forming composition.

Example 3

To 10 g of a solution containing 2 g of the polymer compound obtained in Synthesis Example 3, 0.5 g of tetramethoxymethyl glycoluril (manufactured by Nihon Cytec Industries Inc.; trade name: POWDERLINK (registered trademark) 1174) and 0.05 g of pyridinium p-toluenesulfonic acid were mixed in and the resultant mixture was dissolved in 35.4 g of propylene glycol monomethyl ether and 18.6 g of propylene glycol monomethyl ether acetate to prepare a solution. Thereafter, the solution was filtered using a polyethylene microfilter having a pore diameter of 0.10 μm and further using a polyethylene microfilter having a pore diameter of 0.05 μm to prepare a solution of a resist underlayer film forming composition.

Example 4

To 10 g of a solution containing 2 g of the polymer compound obtained in Synthesis Example 4, 0.5 g of tetramethoxymethyl glycoluril (manufactured by Nihon Cytec Industries Inc.; trade name: POWDERLINK (registered trademark) 1174) and 0.05 g of pyridinium-p-toluenesulfonic acid were mixed in and the resultant mixture was dissolved in 35.4 g of propylene glycol monomethyl ether and 18.6 g of propylene glycol monomethyl ether acetate to prepare a solution. Thereafter, the solution was filtered using a polyethylene microfilter having a pore diameter of 0.10 μm and further using a polyethylene microfilter having a pore diameter of 0.05 μm to prepare a solution of a resist underlayer film forming composition.

Comparative Example 1

There was prepared a solution of a resist underlayer film forming composition containing a copolymer of the following Formula (27) as the polymer and a crosslinker of the following Formula (28) and pyridinium-p-toluene sulfonic acid as the additives,

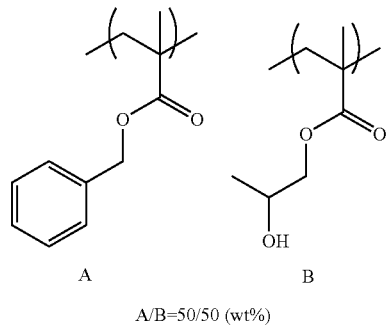

(27)

A/B=50/50 (wt%)

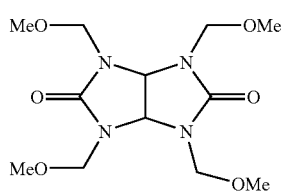

(28)

Comparative Example 2

To 10 g of a solution containing 2 g of the polymer compound obtained in Synthesis Example 5, 0.5 g of tetramethoxymethyl glycoluril (manufactured by Nihon Cytec Industries Inc.; trade name: POWDERLINK (registered trademark) 1174) and 005 g of pyridinium-p-toluenesulfonic acid were mixed in and the resultant mixture was dissolved in 35.4 g of propylene glycol monomethyl ether and 18.6 g of propylene glycol monomethyl ether acetate to prepare a solution. Thereafter, the solution was filtered using a polyethylene microfilter having a pore diameter of 0.10 μm an and further using a polyethylene microfilter having a pore diameter of 0.05 μm to prepare a solution of a resist underlayer film forming composition.

Dissolution Test in Resist Solvent

The solutions of the resist underlayer film forming compositions prepared in Examples 1 to 4 of the present invention were applied (spin-coated) on a silicon wafer using a spinner. The solution of the composition was heated on a hot plate at 205° C. for 1 minute to form a resist underlayer film (film thickness: 0.10 μm). The resist underlayer film was immersed in ethyl lactate and propylene glycol monomethyl ether which are a solvent for the resist solution and it was confirmed that the resist underlayer film was insoluble in the solvent Test for Intermixing with Resist The solutions of the resist underlayer film forming compositions prepared in Example 1 to Example 4 of the present invention were applied on a silicon wafer using a spinner. The solution of the composition was heated on a hot plate at 205° C. for 1 minute to form a resist underlayer film (film thickness: 0.10 μm).

A commercially available resist solution (for example, trade name: AR2772JN; manufactured by JSR Corporation) was applied on the resist underlayer film using a spinner. The resist solution was heated on a hot plate at 110° C. for 1.5 minutes to form a resist film and the resultant resist film was exposed to light using an exposing apparatus, followed by subjecting the resist film to the post exposure bake (PEB) at 110° C. for 1.5 minutes. The resist film was developed and thereafter, the film thickness of the resist underlayer film was measured, so that it was confirmed that there was caused no intermixing between each of the resist underlayer films obtained from the solutions of resist underlayer film forming compositions prepared in Examples 1 to 4, and the resist film.

Test for Optical Parameter

Each of the solutions of the resist underlayer film forming compositions prepared in Example 1 to Example 4 of the present invention, the solution of the resist underlayer film forming composition shown in Comparative Example 1, and the solution of the resist underlayer film forming composition prepared in Comparative Example 2 was applied on a silicon wafer using a spinner. Each solution of the composition was heated on a hot plate at 205° C. for 1 minute to form a resist underlayer film (film thickness: 0.06 μm). Then, the refractive index (n value) and the attenuation coefficient (k value) at the wavelength of 193 nm of each of these six types of resist underlayer films were measured using a spectroscopic ellipsometer (manufactured by J. A. Woollam Co., Inc.; trade name: VUV-VASE VU-302). The result of the measurement is shown in Table 1.

Measurement of Dry Etching Rate

Each of the solutions of the resist underlayer film forming compositions prepared in Example 1 to Example 4 of the present invention, the solution of the resist underlayer film forming composition shown in Comparative Example 1, and the solution of the resist underlayer film forming composition prepared in Comparative Example 2 was applied on a silicon wafer using a spinner. Each solution of the composition was heated on a hot plate at 205° C. for 1 minute to form a resist underlayer film. Then, the dry etching rate of the underlayer film was measured using RIE system ES401 (manufactured by Nippon Scientific Co., Ltd.) under a condition of using $CF_4$ as a dry etching gas.

In substantially the same manner as described above, a resist solution (manufactured by Sumitomo Chemical Co., Ltd.; trade name: PAR710) was applied on a silicon wafer using a spinner to form a resist film. Then, the dry etching rate of the resist film was measured using RIE system ES401 (manufactured by Nippon Scientific Co., Ltd.) under a condition of using $CF_4$ as a dry etching gas.

There was compared the dry etching rate of each of the six types of resist underlayer films obtained from the solutions of resist underlayer film forming compositions of Example 1 to Example 4 and Comparative Example 1 to Comparative Example 2 with the dry etching rate of the resist film obtained from the resist solution (manufactured by Sumitomo Chemical Co., Ltd.). The ratio (selection ratio of dry etching rate) of the dry etching rate of the resist underlayer film relative to the dry etching rate of the resist film is shown in Table 1.

TABLE 1

| | Refractive index (n value) | Attenuation coefficient (k value) | Wavelength (nm) | Selection ratio of dry etching rate |
|---|---|---|---|---|
| Example 1 | 1.57 | 0.25 | 193 | 1.50 |
| Example 2 | 1.58 | 0.20 | 193 | 1.46 |
| Example 3 | 1.68 | 0.21 | 193 | 1.56 |
| Example 4 | 1.78 | 0.32 | 193 | 1.71 |
| Comparative Example 1 | 1.84 | 0.48 | 193 | 1.10 |
| Comparative Example 2 | 1.80 | 0.48 | 193 | 1.56 |

The resist underlayer film obtained from the resist underlayer film forming composition of the present invention has a satisfactorily effective refractive index (n value) and attenuation coefficient (k value) at least relative to a light of 193 nm, and the attenuation coefficient of each Example (particularly Example 1 to Example 3) exhibits a value lower than that of Comparative Example 1 or Comparative Example 2. Moreover, the resist underlayer film has a selection ratio of dry etching rate larger than that of the resist film, and further, each Example has a selection ratio of dry etching rate larger than that of Comparative Example 1. Therefore, the time required for removing the resist underlayer film by dry etching can be reduced. In addition, it is possible to suppress such an undesired phenomenon that the film thickness of the resist film on the resist underlayer film decreases in conjunction with the removal of the resist underlayer film by dry etching.

Formation and Evaluation of Resist Pattern

By spin-coating a silicon wafer with each of the solutions of the resist underlayer film forming compositions prepared in Example 1 to Example 4 of the present invention and by heating the resultant coating at 205° C. for 1 minute, the resist underlayer film was formed. The resist underlayer film was spin-coated with a resist solution for ArF excimer laser (manufactured by JSR Corporation; trade name: AR2772JN) and the resultant coating was heated at 110° C. for 90 seconds. The resultant film was subjected to the exposure using an exposure apparatus for ArF excimer laser (manufactured by ASML Holding N.V.; trade name: ASM 5500/1100) under a predetermined condition and was subjected to heating (PES) at 110° C. for 90 seconds after the exposure. The film was cooled down to the room temperature on a cooling plate and was subjected to the development and the rinse treatment to form the resist pattern.

It could be confirmed that the objective resist pattern was formed by: setting the objective line width to 80 nm line and space; measuring the resist pattern size under a condition of the optimal exposure amount and the optimal focus with a length measuring SEM; and observing the cross section form of the resist pattern with a cross section SEM.

The invention claimed is:

1. A resist underlayer film forming composition for lithography comprising:

a linear polymer having a repeating unit structure of Formula (1):

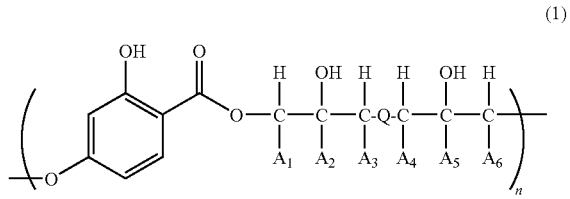

(where $A_1$, $A_2$, $A_3$, $A_4$, $A_5$ and $A_6$ are independently a hydrogen atom, a methyl group or an ethyl group; n is a repeating number of the unit structure and is an integer of 10 to 10,000;

and Q is a group of Formula (2):

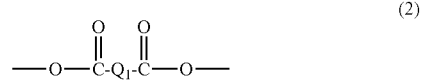

(where $Q_1$ is a $C_{1-10}$ alkylene group, a divalent organic group having a $C_{3-10}$ alicyclic hydrocarbon, a phenylene group, a naphthylene group or an anthrylene group, where the phenylene group, the naphthylene group and the anthrylene group are optionally substituted independently with at least one group selected from a group consisting of a $C_{1-6}$ alkyl group, a halogen atom, a $C_{1-6}$ alkoxy group, a nitro group, a cyano group and a $C_{1-6}$ alkylthio group)); and a solvent.

2. A resist underlayer film forming composition for lithography comprising:

a linear polymer having a repeating unit structure of Formula (1):

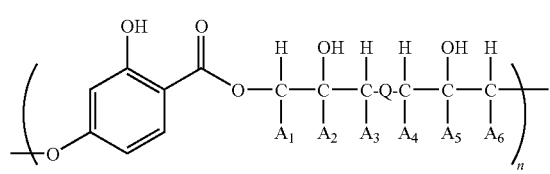

(1)

(where $A_1, A_2, A_3, A_4, A_5$ and $A_6$ are independently a hydrogen atom, a methyl group or an ethyl group; n is a repeating number of the unit structure and is an integer of 10 to 10,000; and Q is a group of Formula (3):

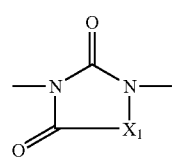

(3)

(where $X_1$ is a group of Formula (4) or Formula (5):

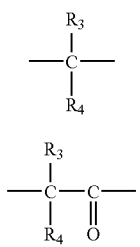

(4)

(5)

(where $R_3$ and $R_4$ are independently a hydrogen atom, a $C_{1-6}$ alkyl group, a $C_{3-6}$ alkenyl group, a benzyl group or a phenyl group, where the phenyl group is optionally substituted with at least one group selected from a group consisting of a $C_{1-6}$ alkyl group, a halogen atom, a $C_1$ alkoxy group, a nitro group, a cyano group and a $C_{1-6}$ alkylthio group, or $R_3$ and $R_4$ together with a carbon atom to which $R_3$ and $R_4$ are bonded optionally form a $C_{3-6}$ ring))); and
a solvent.

3. A resist underlayer film forming composition for lithography comprising:
a linear polymer having a repeating unit structure of Formula (1):

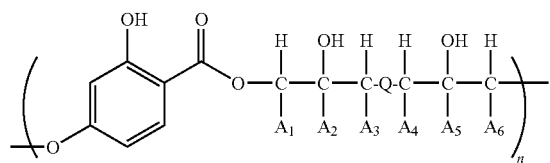

(1)

(where $A_1, A_2, A_3, A_4, A_5, A_6$ are independently a hydrogen atom, a methyl group or an ethyl group; n is a repeating number of the unit structure and is an integer of 10 to 10,000; and Q is a group of Formula (6):

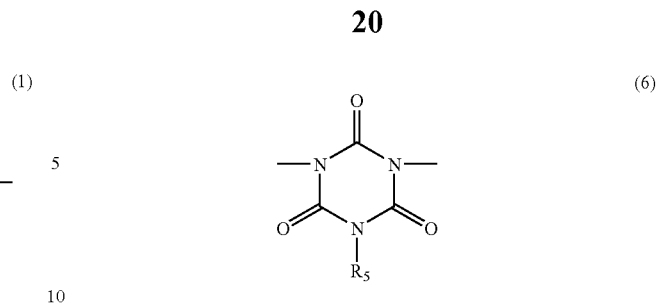

(6)

(where $R_5$ is a $C_{1-6}$ alkyl group, a $C_{3-6}$, alkenyl group, a benzyl group or a phenyl group, where the phenyl group is optionally substituted with at least one group selected from a group consisting of a $C_{1-6}$ alkyl group, a halogen atom, a $C_{1-6}$ alkoxy group, a nitro group, a cyano group and a $C_{1-6}$ alkylthio group)); and
a solvent.

4. A resist underlayer film forming composition for lithography comprising:
a linear polymer having a repeating unit structure of Formula (1):

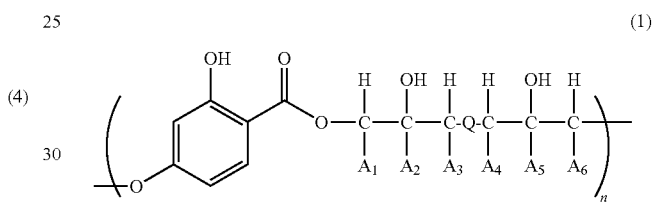

(1)

(where n is a repeating number of the unit structure and is an integer of 10 to 10,000);
wherein the linear polymer is a reaction product between a compound of Formula (7):

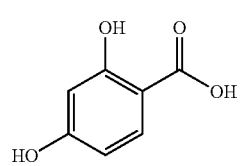

(7)

and at least one compound of Formula (8):

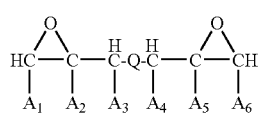

(8)

where in Formula (1) and Formula (8) $A_1, A_2, A_3, A_4, A_5$, and $A_6$ are independently a hydrogen atom, a methyl group or an ethyl group; and Q is
a group of Formula (9):

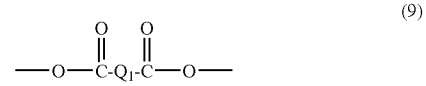

(9)

(where $Q_1$ is a $C_{1-10}$ alkylene group, a divalent organic group having a $C_{3-10}$ alicyclic hydrocarbon, a phenylene group, a naphthylene group or an anthrylene group, where the phenylene group, the naphthylene group and the anthrylene group are optionally substituted independently with at least one group selected from a group consisting of a $C_{1-6}$ alkyl group, a halogen atom, a $C_{1-6}$ alkoxy group, a nitro group, a cyan group and a $C_{1-6}$ alkylthio group).

5. The resist underlayer film forming composition for lithography according to claim 4, wherein the compound of Formula (8) is a compound of Formula (10):

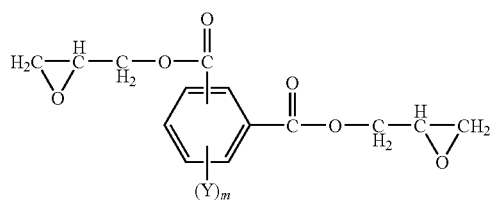

(where Y is a $C_{1-6}$ alkyl group, a halogen atom, a $C_{1-6}$ alkoxy group, a nitro group, a cyano group or a $C_{1-6}$ alkylthio group; and m is an integer of 0 to 4, where the Y is optionally identical or different when m is 2 to 4).

6. A resist underlayer film forming composition for lithography comprising:
a linear polymer having a repeating unit structure of Formula (1):

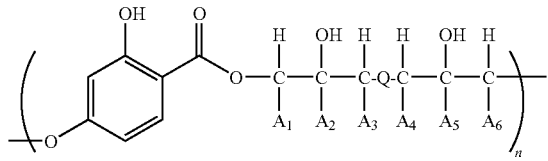

(where n is a repeating number of the unit structure and is an integer of 10 to 10,000);

wherein the linear polymer is a reaction product between a compound of Formula (7):

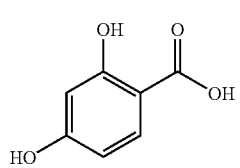

and at least one compound of Formula (8):

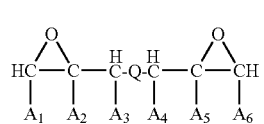

(where in Formula (1) and Formula (8), $A_1, A_2, A_3, A_4, A_5$ and $A_6$ are independently a hydrogen atom, a methyl group or an ethyl group; and Q is
a group of Formula (11):

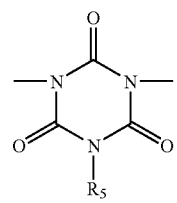

(where $R_5$ is a $C_{1-6}$ alkyl group, a $C_{3-6}$ alkenyl group, a benzyl group or a phenyl group, where the phenyl group is optionally substituted with at least one group selected from a group consisting of a $C_{1-6}$ alkyl group, a halogen atom, a $C_{1-6}$ alkoxy group, a nitro group, a cyano group and a $C_{1-6}$ alkylthio group).

* * * * *